(12) United States Patent
Lee (10) Patent No.: US 7,202,548 B2
(45) Date of Patent: Apr. 10, 2007

(54) EMBEDDED CAPACITOR WITH INTERDIGITATED STRUCTURE

(75) Inventor: Sheng-Yuan Lee, Shindian (TW)

(73) Assignee: VIA Technologies, Inc., Taipei (TW)

( * ) Notice: Subject to any disclaimer, the term of this patent is extended or adjusted under 35 U.S.C. 154(b) by 0 days.

(21) Appl. No.: 11/224,224

(22) Filed: Sep. 13, 2005

(65) Prior Publication Data

US 2007/0057344 A1   Mar. 15, 2007

(51) Int. Cl.
  *H01L 29/00* (2006.01)
(52) U.S. Cl. ............... 257/532; 257/499; 257/528; 257/E29.001
(58) Field of Classification Search ............ None
  See application file for complete search history.

(56) References Cited

U.S. PATENT DOCUMENTS 5,583,359 A * 12/1996 Ng et al. ............ 257/306

6,635,916 B2   10/2003 Aton

* cited by examiner

*Primary Examiner*—Leonardo Andujar
*Assistant Examiner*—Kevin Quinto
(74) *Attorney, Agent, or Firm*—Birch, Stewart, Kolasch & Birch, LLP (57) ABSTRACT

An embedded capacitors with interdigitated structure for a package carrier or a printed circuit board comprises a plurality of stacked conductive layers, at least one first via connecting structure and at least one second via connecting structure. In order to enhance the capacitance and the layout efficiency, this case fully utilizes the spaces between the via connecting structures for disposing at least one extending line extended from the via connecting structure to simultaneously increase side-to-side and layer-to-layer capacitances. Thus, the present invention provides a capacitance larger than that of conventional design.

22 Claims, 8 Drawing Sheets

EMBEDDED CAPACITOR WITH INTERDIGITATED STRUCTURE

BACKGROUND OF THE INVENTION

1. Field of Invention

The present invention relates to an embedded capacitor for a substrate, and more particularly to an embedded capacitor with interdigitated structure for a substrate.

2. Related Art

Demands for high-density and high-speed performance have challenged current circuit board industry. In order to create more functionality in a smaller form factor, while supporting high clock speeds, with reduced EMI, at a reduced cost, design choices often involve compromising tradeoffs between size, cost and performance. Embedded passive elements enable designers to embed passive circuit elements inside the board, freeing up valuable real estate on the surface. The result is reducing board size and form factor, or additional functionality with the same board size. Embedded passive elements also provide increased placement and routing flexibility to put passive circuit elements in closer proximity to the I/O pads of an integrated circuit (IC). The shorter interconnects result in lower parasitic inductances, faster switching speeds and reduced noise in the circuit. Cost savings can be realized when the total value of the technology is taken into account, especially for applications with a high density of passive elements.

Metal-insulator-metal (MIM) capacitor is one of the common used embedded passive elements in a semiconductor substrate. A MIM capacitor is a particular type of capacitor having a dielectric sandwiched between two metal plates parallel to the circuit surface. The patterning of the top metal plate requires an additional process, and there will be alignment problems to underlying features (e.g., bottom metal plate) and vias to connect to interconnect layers. Another problem in fabricating MIM capacitor is a restriction in the selection of the dielectric materials. Due to potential interaction with or diffusion of the metals (such as copper) used for the metal plates, the dielectric material restriction may result in limited area capacitance.

Figure 1:
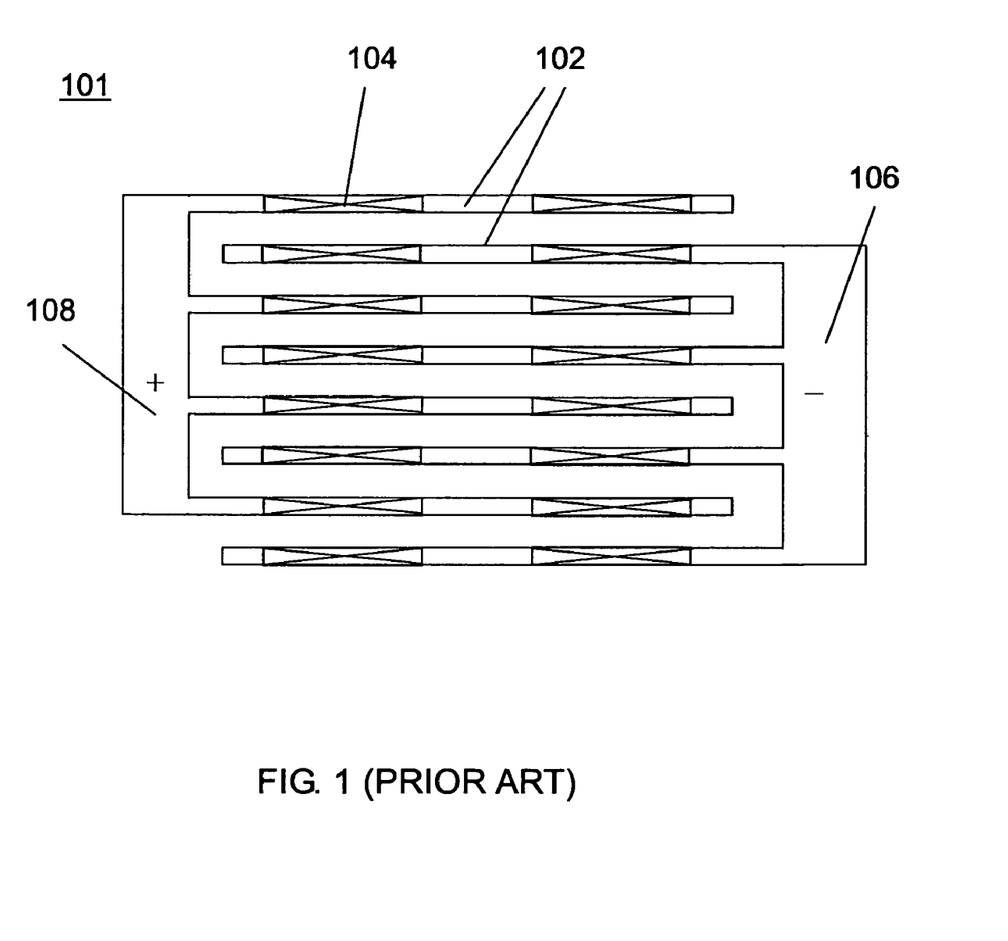
FIG. 1 shows a conventional interdigitated capacitor in a IC.

Interdigitated capacitor is another embedded capacitor formed in a semiconductor substrate. Referring to FIG. 1, a conventional interdigitated capacitor in a substrate or in an integrated circuit is disclosed in U.S. Pat. No. 6,635,916. To provide a larger sidewall capacitance, the interdigitated capacitor includes at least two interdigitated patterns 101 connected through a plurality of vias 104 (marked with "x"). The vias 104 can be made into trenches that connect all along the length of some, most, or all of the metal lines, forming a wall of metal between lines that effectively extends through several levels. The interdigitated pattern 101 consists of a plurality of metal lines 102 alternatively connected to two different electrodes 106 and 108 in one layer of the substrate. The side-to-side capacitance is normally much larger than the layer-to-layer capacitance because the side-to-side distance is much smaller than the layer-to-layer distance in the integrated circuit. The interdigitated capacitor has a larger capacitance as the size shrinking of the IC process. However, the size shrinking also means a higher cost in manufacture; it is in a dilemma of reducing costs or enhancing the performance.

Figure 2A:
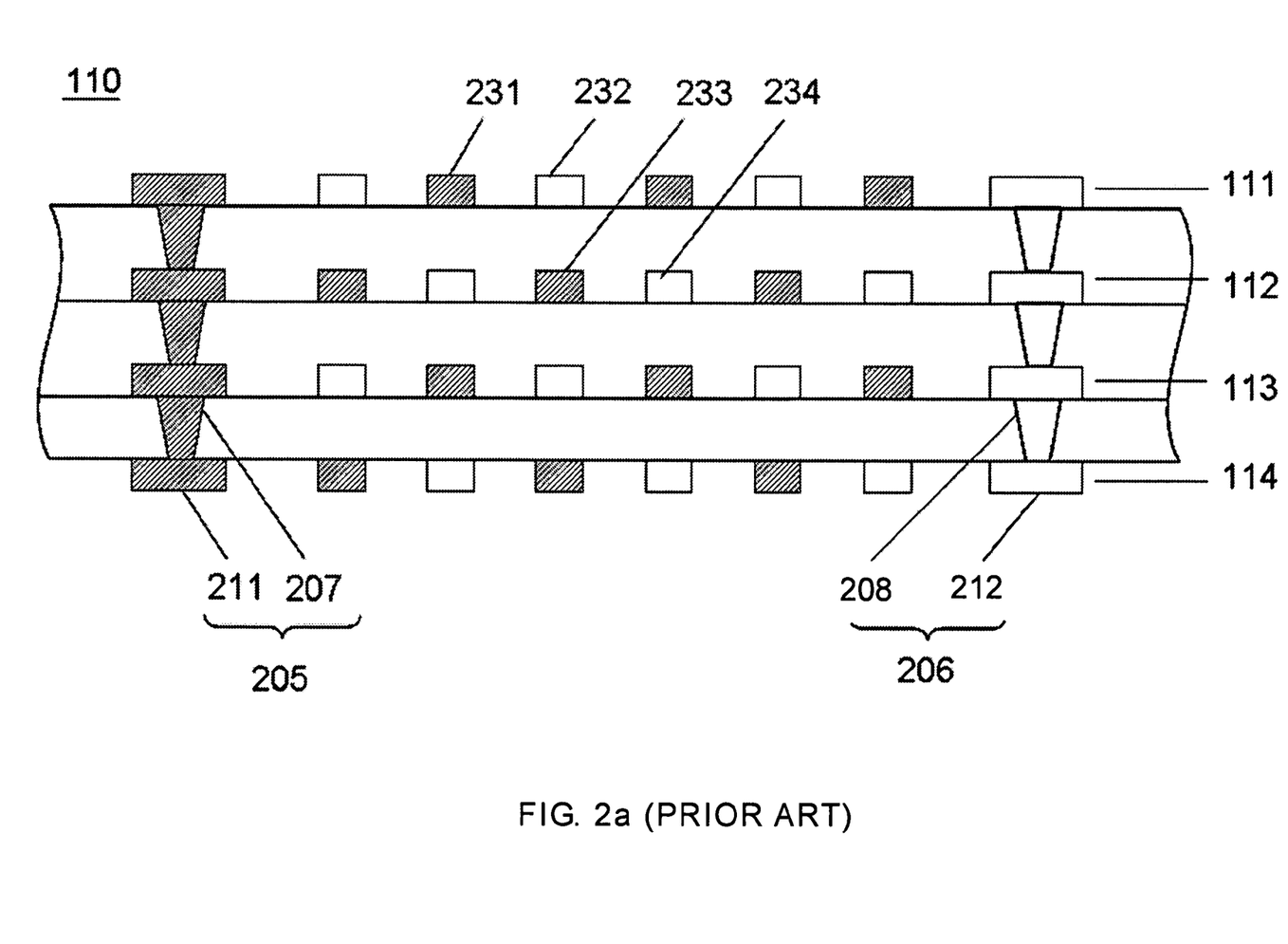
FIG. 2a shows a cross-sectional view of the conventional interdigitated capacitor.
Figure 2B:
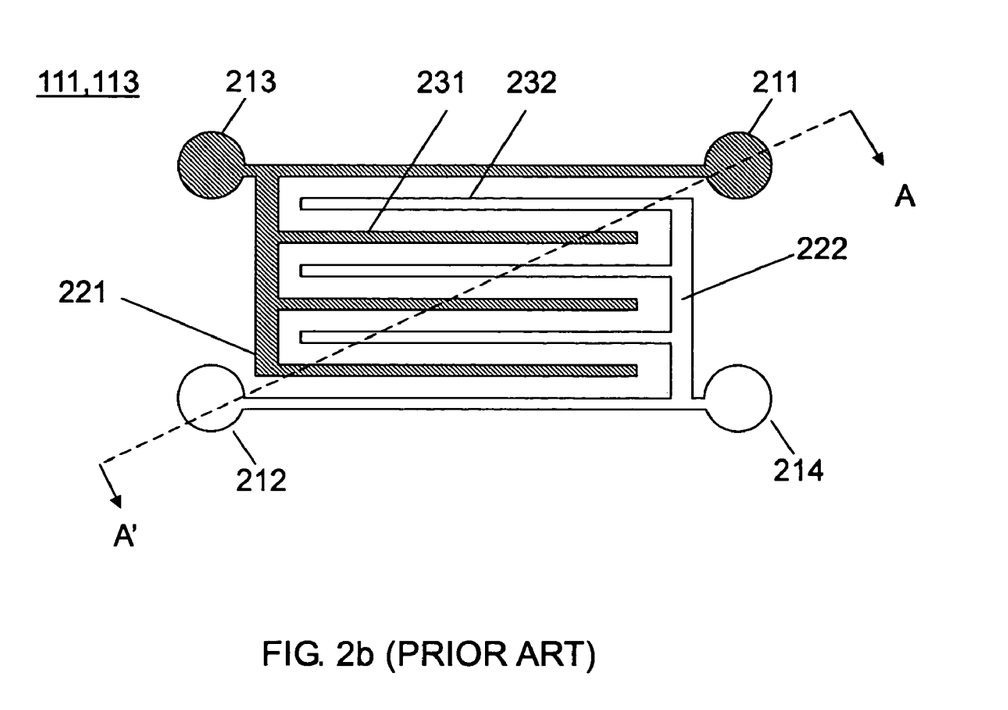
FIGS. 2b and 2c respectively show the top views of two different conductive layers in the conventional interdigitated capacitor.
Figure 2C:
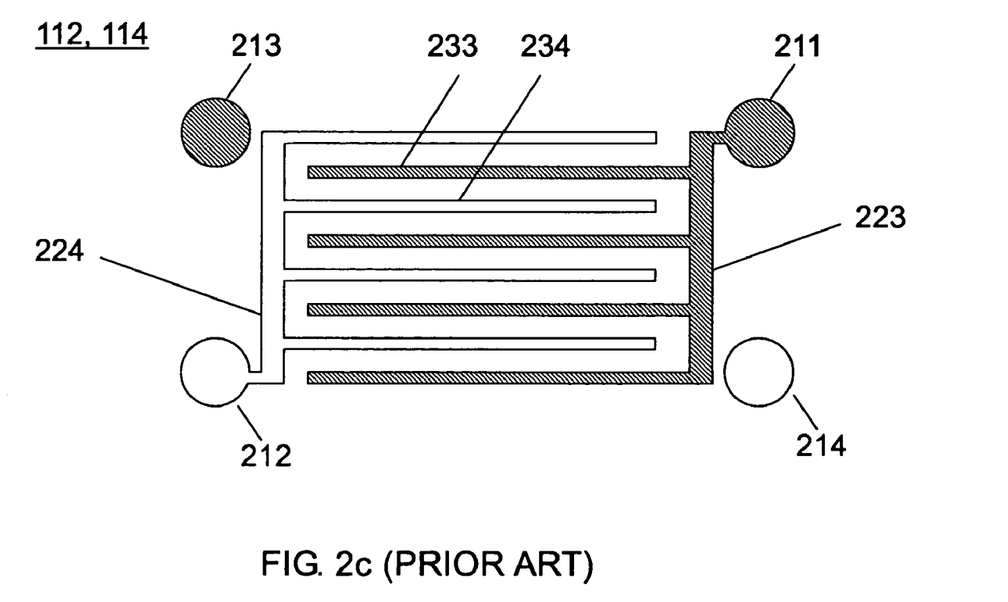

Applying the embedded capacitors to a laminated substrate, such as a package carrier or a printed circuit board, is another approach for the benefits of cost and performance. Referring to FIGS. 2a to 2c, an interdigitated capacitor 110 is disclosed. FIG. 2a shows a cross-sectional view of the interdigitated capacitor 110 along line A—A' shown in FIG. 2b. The interdigitated capacitor 110 applied to a four-layer substrate consists of four patterns 111, 112, 113 and 114 disposed in different conductive layers and four via connecting structures. The first via connecting structure 205 has four via pads 211 and three connecting vias 207 between two different via pads 211. The second via connecting structure 206 has four via pads 212 and three connecting vias 208 between two via pads 212. Referring to FIG. 2b, the first pattern 111 consists of a plurality of first strips 231 parallel to each other, a plurality of second strips 232 interdigitated with the first strips 231, a first connecting line 221 connected with one end of each first strip 231, and a second connecting line 222 connected with one end of each second strip 232. The first via pads 211 is disposed in one corner around the first pattern 111. The third via pad 213 of another via connecting structure which is similar to the first via connecting structure 205 shown in FIG. 2a is disposed to an adjacent corner around the first pattern 111. The second via pad 212 is disposed on the diagonal corner with respect to the first via pad 211 and the fourth via pad 214 of the other via connecting structure similar to the second via connecting structure 206 is disposed on the right-down corner in FIG. 2b. However, because of the restrictions in the fabrication, the package carrier and a circuit board have via pads larger than the metal line. For example, the diameter of a via pad 211 at least is twice the width of the first connecting line 221. Please note that the space between the first via pad 211 and the fourth via pad 214 and the space between the second via pad 212 and the third via pad 213 are not used. In other words, it means a lower efficiency in layout, a larger circuit size and a higher cost.

Accordingly, it is desirable to provide an embedded capacitor with interdigitated structure for achieving high-capacitance and lower cost, especially for a substrate having large vias.

SUMMARY OF THE INVENTION

In order to solve the above-mentioned problems, the present invention provides an embedded capacitor with interdigitated structure for a substrate, such as a circuit substrate including but not be limited to package carrier or printed circuit board, to enhance capacitance and efficiency of the circuit layout.

To achieve the above, an embedded capacitor with interdigitated structure according to the present invention for a substrate, comprising a plurality of stacked conductive layers, at least one first via connecting structure and at least one second via connecting structure. The conductive layer has at least one first conductive pattern. The first conductive pattern comprises a first electrode and a second electrode. The first electrode comprises a plurality of first strips parallel to each other, a first connecting line respectively electrically connected to one end of the first strips and a first extending line. The second electrode comprises a plurality of second strips interdigitated with the first strips and a second connecting line respectively electrically connected to one end of the second strips. The first via connecting structure is electrically connected with the first electrode and at least one another conductive layer. The second via connecting structure is electrically connected with the second electrode and at least one another conductive layer. The first extending line is extended from the first via connecting structure and is adjacent to the second electrode.

The second electrode may further comprise a second extending line extended from the second via connecting structure and adjacent to the first electrode. Under the similar arrangement in adjacent conductive layers, the electrodes form interdigitated structures not only in horizontal direction but in vertical direction, and the second extending line and a fourth extending line also form another interdigitated structure to provide a higher layer-to-layer capacitance. For example, the stacked structure could be an interdigitated structure or a spiral structure. The stacked structure coupled with these interdigitated structures between the via connecting structures provides a higher equivalent capacitance because of the enhanced layer-to-layer capacitance.

A first capacitance is provided between the electrodes and between the conductive layers. A second capacitance is provided by disposing the extending lines respectively adjacent to the electrodes to be side-to-side capacitance. A third capacitance is provided between the extending lines in adjacent conductive layer to be layer-to-layer capacitance. In summary, an embedded capacitor with interdigitated structure according to the present invention integrates capacitance within and between the conductive layers in horizontal and vertical directions to enhance capacitance and efficiency of the circuit layout.

To optimize the space between the first via connecting structure and the second via connecting structure, another embedded capacitor with interdigitated structure according to the present invention comprises a first pattern and a second pattern respectively disposed in two adjacent conductive layers. A first electrode of the first pattern comprise a plurality of first parallel strips, a first connecting line respectively electrically connected to one end of the first strips, and a first extending line; likewise a second electrode of the first pattern comprising a plurality of second strips interdigitated with the first strips, a second connecting line respectively electrically connected to one end of the second strips, and a second extending line. The first pattern provides a higher side-to-side capacitance resulting from a planar interdigitated structure consisting of the second connecting line, the first extending line and the second extending line. Similarly, the second pattern comprises a plurality of third strips overlapped with the second strips, a plurality of fourth strips overlapped with the first strips, a third connecting line overlapped with the second connecting line, a fourth connecting line overlapped with the first connecting line, a third extending line overlapped with the first extending line, and a fourth extending line overlapped extending line. The interdigitated structure consisting of the third connecting line, the third extending line and the fourth extending line also provides an additional capacitance for the second pattern. Furthermore, the interdigitated structure consisting of the first extending line and the third extending line provides a higher layer-to-layer capacitance. Thus, the embedded capacitor with interdigitated structure according to the present invention provides a higher equivalent capacitance because the layer-to-layer capacitance and the side-to-side capacitance are both enhanced.

The construction and method of operation of the invention, however, together with additional objects and advantages thereof will be best understood from the following description of specific embodiments when read in connection with the accompanying drawings.

BRIEF DESCRIPTION OF THE DRAWINGS

Reference will now be made in detail to the present preferred embodiments of the present invention, examples of which are illustrated in the accompanying drawings. Wherever possible, the same reference numbers are used in the drawings and the description to refer to the same or like parts.

DETAILED DESCRIPTION OF THE INVENTION

Figure 3A:
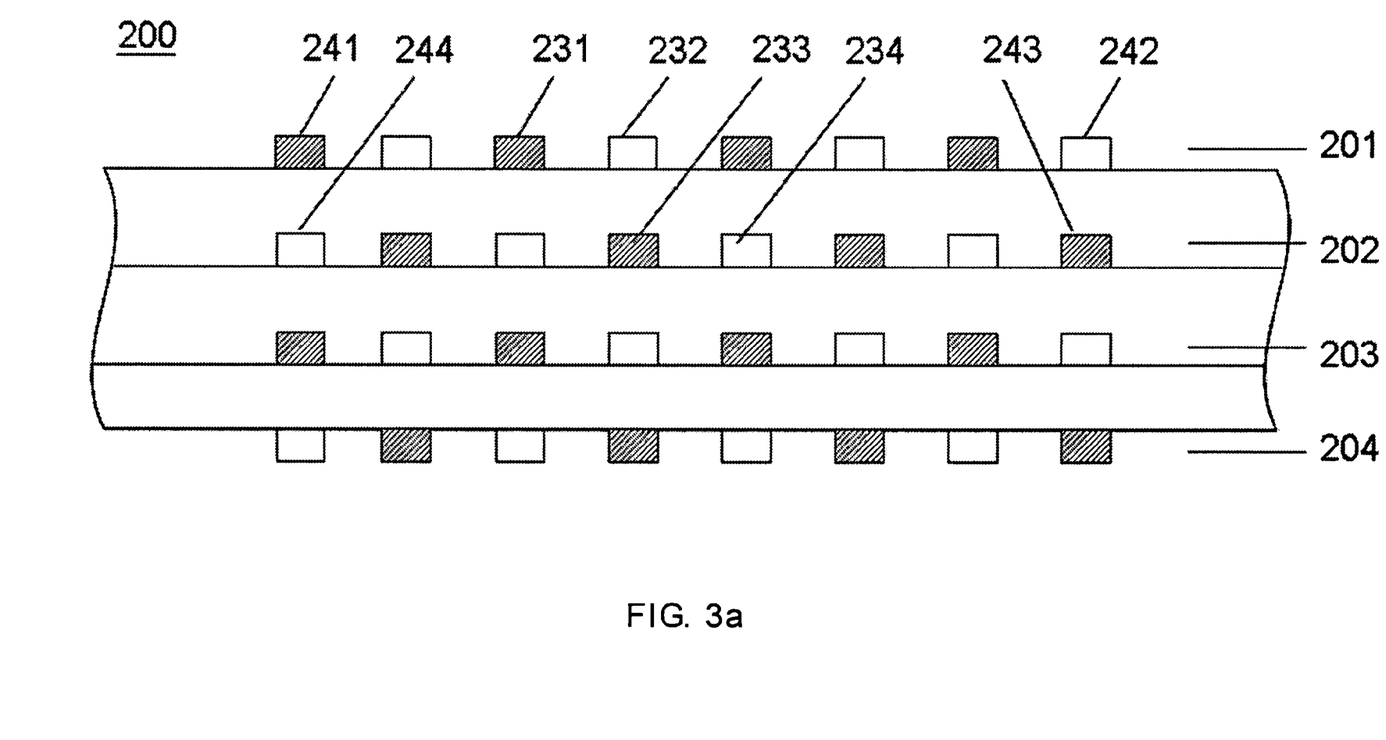
FIG. 3a shows a cross-sectional view of a first embodiment according to the present invention.
Figure 3B:
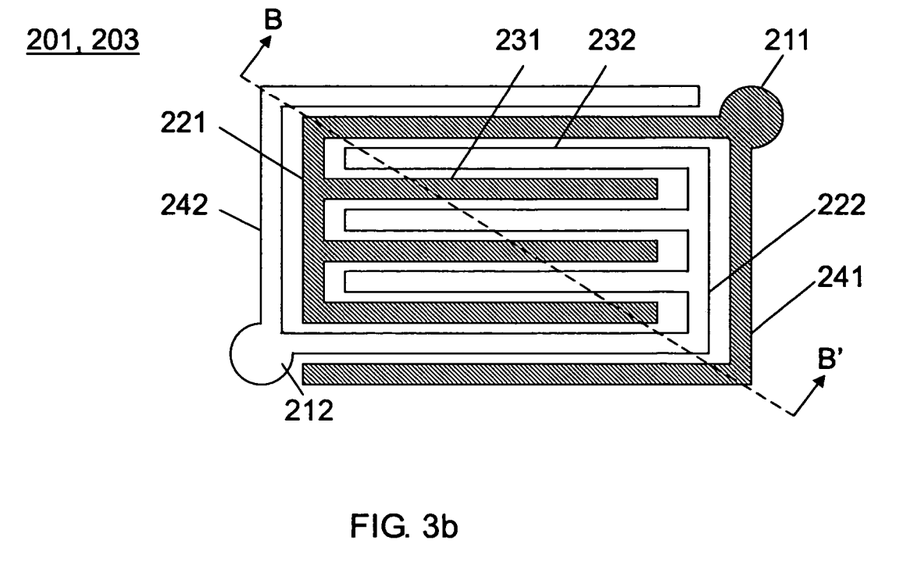
FIGS. 3b and 3c respectively show top views of two different conductive layers of the first embodiment according to the present invention.
Figure 3C:
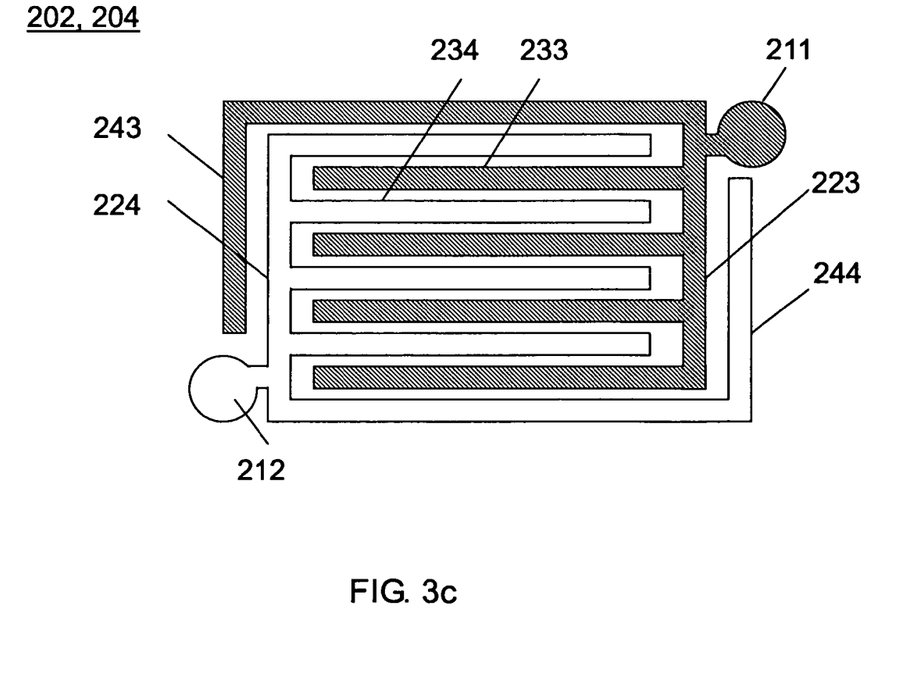

Referring to FIGS. 3a to 3c, a first embodiment of an embedded capacitor 200 with interdigitated structure according to the present invention is applied in a four-layer circuit substrate. FIG. 3a shows a cross-sectional view of the embedded capacitor 200 with interdigitated structure along line B—B' shown in FIG. 3b. In this embodiment, the embedded capacitor 200 with interdigitated structure comprises four stacked conductive layers 201, 202, 203 and 204 connected with each other through a first via connecting structure and a second via connecting structure (as 205 and 206 shown in FIG. 2a). The first via connecting structure has four first via pads 211 respectively disposed in the conductive layers and three first connecting vias 207 to respectively connect with the adjacent first via pads 211. The second via connecting structure has four second via pads 212 respectively disposed in the conductive layers and three second connecting vias 208 to connect with the adjacent second via pads 212. FIG. 3b shows top views of the first conductive layer 201 and the third conductive layer 203. The first conductive layer 201 comprises a plurality of first strips 231 and a plurality of second strips 232 interdigitately disposed and parallel to each other. A first connecting line 221 is respectively electrically connected to one end of the first strips 231. A second connecting line 222 is respectively electrically connected to one end of the second strips 232. The interdigitated structure is consisted of the first strips 231 and the second strips 232 just like the fingers of one hand folded those of the other hand. The first via pad 211 is disposed at one corner of the first conductive layer 201 and is electrically connected to the first connecting line 221. The second via pad 212 is disposed at the diagonal corner of the first conductive layer 201 and is electrically connected to the second connecting line 222. A first extending line 241 extends from the first via pad 211 and a second extending line 242 extends from the second via pad 212. The first strips 231, the first connecting line 221 and the first extending line 241 are coupled as a first electrode of the first conductive layer 201. The second strips 232, the second connecting line 222 and the second extending line 242 are coupled as a second electrode of the first conductive layer 201. Because the first extending line 241 is adjacent to the second electrode and the second extending line 242 is adjacent to the first electrode, the first conductive layer 201 provides a higher capacitance than the conventional conductive layer 111 shown in FIG. 2b.

FIG. 3c shows top views of the second conductive layer 202 and the fourth conductive layer 204. Similar to the first conductive layer 201, the second conductive layer 202 comprises a plurality of third strips 233 and a plurality of fourth strips 234 constructed as interdigitated structure. A third connecting line 223 is respectively electrically connected to one end of the third strips 233, and a fourth connecting line 224 is respectively electrically connected to one end of the fourth strips 234. The third connecting line 223 is connected to the first via pad 211 and the fourth connecting line 224 is connected to the second via pad 212. The second conductive layer 202 further comprises a third extending line 243 extending from the first via pad 211 and a fourth extending line 244 extending from the second via pad 212. The third strips 233, the third connecting line 223 and the third extending line 243 are coupled as a third electrode of the second conductive layer 202, and the fourth strips 234, the fourth connecting line 224 and the fourth extending line 244 are coupled as a fourth electrode of the second conductive layer 202. Similarly, the first conductive layer 201, the second conductive layer 202 also provides a higher side-to-side capacitance than the conventional conductive layer 112 shown in FIG. 2c.

As shown in FIGS. 3a to 3c, the first conductive layer 201 is disposed over the second conductive layer 202. The first strips 231 are disposed over the fourth strips 234 and the second strips 232 are respectively disposed over the thirds strips 233. Similarly, the second connecting line 222 is disposed over the third connecting line 223 and the first connecting line 221 is disposed over the fourth connecting line 224. The first extending line 241 is disposed over the fourth extending line 244, and the second extending line 242 is disposed over the third extending line 243. In other words, the first electrode of the first conductive layer 201 is disposed over the fourth electrode of the second conductive layer 202, and the second electrode of the first conductive layer 201 is disposed over the third electrode of the second conductive layer 202. Furthermore, the second conductive layer 202 is disposed over the third pattern 203, and the third conductive layer 203 is disposed over the fourth conductive layer 204. The first via connecting structure 205 is electrically connected with the first electrode of the first conductive layer 201, the third electrode of the second conductive layer 202, the first electrode of the third conductive layer 203 and the third electrode of the fourth conductive layer 204. The second via connecting structure 206 is electrically connected with the second electrode of the first conductive layer 201, the fourth electrode of the second conductive layer 202, the second electrode of the third conductive layer 203 and the fourth electrode of the fourth conductive layer 204. An interdigitated structure consisting of the first extending line 241 and the fourth extending line 244 and another interdigitated structure consisting of the second extending line 242 and the third extending line 243, the embedded capacitor 200 has a larger layer-to-layer capacitance.

Thus, the embedded capacitor 200 with interdigitated structure according to the present invention has a plurality of side-to-side capacitances and a plurality of layer-to-layer capacitances connected in parallel to achieve a larger equivalent capacitance. When the side-to-side distance is close to the layer-to-layer distance in a circuit substrate, for example in a chip carrier or in a printed circuit board, an optimized equivalent capacitance is achieved. Please note that the diameter of the via pad is larger than the width of the extending line. For example, the via pads 211 and 212 have a diameter of about 150 μm and the pitch between two adjacent strips is about 80 μm, the space between via pads could dispose two parallel strips or conductive lines.

Figure 4A:
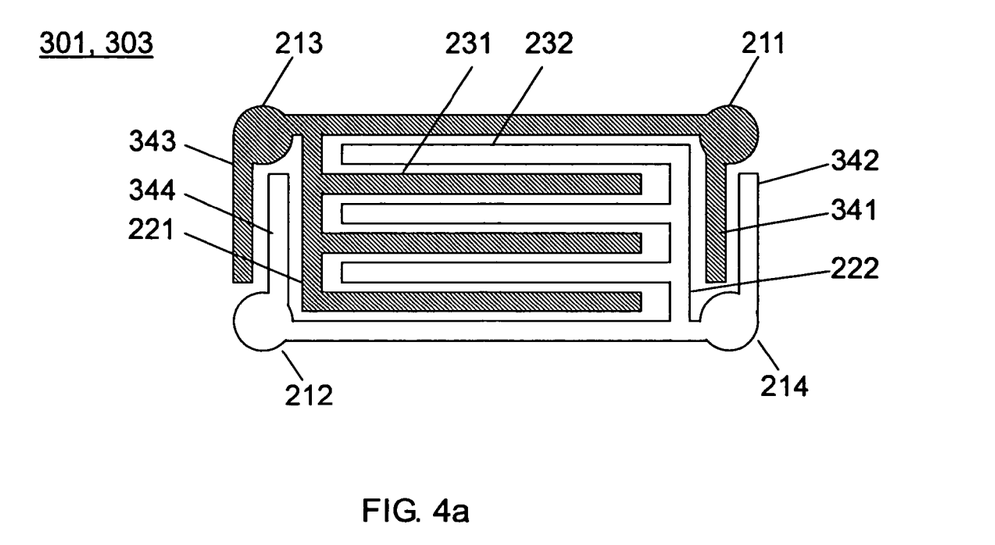
FIGS. 4a and 4b respectively show top views of two different conductive layers of a second embodiment according to the present invention.
Figure 4B:
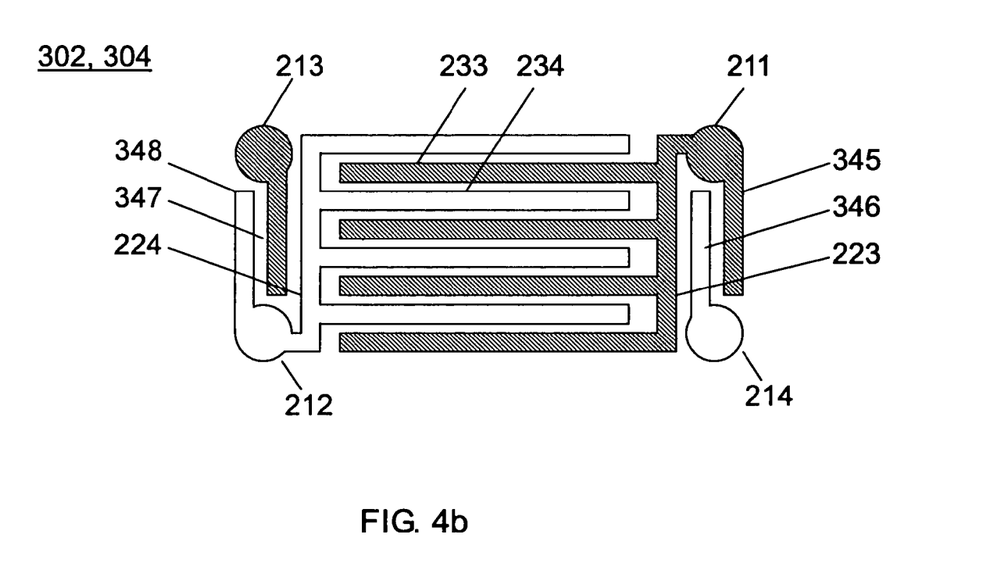

In order to improve the capacitance, a second embodiment of an embedded capacitor with interdigitated structure according to the present invention applied in a four-layer circuit substrate is disclosed in FIGS. 4a and 4b. In this embodiment, the embedded capacitor with interdigitated structure comprises four stacked conductive layers 301, 302, 303 and 304 and four via connecting structures which respectively having a plurality of via pads 211, 212, 213 and 214. The conductive layers 301, 302, 303 and 304 are electrically connected with each other through the via connecting structures. A first via connecting structure has four via pads 211 and a second via connecting structure has four via pads 212 respectively disposed in two diagonal corners of the conductive layers, and a third via connecting structure has four via pads 213 and a fourth via connecting structure has four via pads 214 respectively disposed in the other diagonal corners of the conductive layers. The conductive layer 301 comprises a first electrode and a second electrode. The first electrode of the conductive layer 301 comprises a plurality of first strips 231 parallel to each other, a first connecting line 221 respectively electrically connected to one end of the first strips 231, and a first extending line 341 extended from the first via pad 211. The second electrode of the conductive layer 301 comprises a plurality of second strips 232 interdigitated with the first strips 231, a second connecting line 222 respectively electrically connected to one end of the second strips 232, and a second extending line 342 extended from the fourth via pad 214. In addition, the first connecting line 221 is electrically connected with the first via pad 211 and the third via pad 213. The second connecting line 222 is electrically connected with the second via pad 212 and the fourth via pad 214. Please note that the first extending line 341 is extended toward the fourth via pad 214 and is parallel and adjacent to the second connecting line 222, and the second extending line 342 is extended toward the first via pad 211 and is parallel and adjacent to the first extending line 341. The interdigitated structure consisting of the second connecting line 222, the first extending line 341 and the second extending line 342 provides an additional side-to-side capacitance for the conductive layer 301. In the other words, the coupling between the second connecting line 222 and the first extending line 341 and the coupling between the first extending line 341 and the second extending line 342 provide a larger side-to-side capacitance comparing to the first conductive layer 201 in the first embodiment.

Referring to FIG. 4b, another via pads 211, 212, 213 and 214 are respectively disposed in the four corners of the conductive layer 302. The conductive layer 302 comprises a plurality of third strips 233 and a plurality of fourth strips 234 interdigitated with each other, the third connecting line 223 respectively electrically connected to one end of the third strips 233, the fourth connecting line 224 respectively electrically connected to one end of the fourth strips 234, a third extending line 346 extended from the fourth via pad 214, and a fourth extending line 345 extended from the first via pad 211. The third strips 233, the third connecting line 223 and the fourth extending line 345 are coupled as a third electrode of the conductive layer 302. The fourth strips 234, the fourth connecting line 224 and the third extending line 346 are coupled as a fourth electrode of the conductive layer 302. The third extending line 346 is parallel and adjacent to the third connecting line 223, and the fourth extending line 345 is parallel and adjacent to the third extending line 346. Thus, the interdigitated structure consisting of the third connecting line 223, the third extending line 346 and the fourth extending line 345 provides an additional side-to-side capacitance for the conductive layer 302.

Furthermore, the second electrode of the conductive layer 301 is disposed over the third electrode of the conductive layer 302 and the first electrode of the conductive layer 301 is disposed over the fourth electrode of the conductive layer 302. The second strips 232 are disposed over the third strips 233, and the first strips 231 are disposed over the fourth strips 234. The first connecting line 221 and the second connecting line 222 are respectively disposed over the fourth connecting line 224 and the third connecting line 223. The first extending line 341 is disposed over the third extending line 346, and the second extending line 342 is disposed over the fourth extending line 345. Please note that the third electrode of the conductive layer 302 and the first electrode of the conductive layer 301 are electrically connected through the first via connecting structure and the third via connecting structure. Similarly, the fourth electrode of the conductive layer 302 and the second electrode of the conductive layer 301 are electrically connected through the second via connecting structure and the fourth via connecting structure. The second connecting line 222 is connected with a via pad 212 of the second via connecting structure and a via pad 214 of the fourth via connecting structure. The second extending line 342 and the third extending line 346 are connected through the fourth via connecting structure.

In other words, the first via connecting structure is electrically connected with the first connecting line 221 and the first extending line 341 of the conductive layer 301 and the third connecting line 223 and the fourth extending line 345 of the conductive layer 302. The second via connecting structure is electrically connected with the second connecting line 222 and the fourth connecting line 224. The third via connecting structure is electrically connected with the first connecting line 221, and the fourth via connecting structure is electrically connected with the second connecting line 222, the second extending line 342 and the third extending line 346. The first extending line 341, the second extending line 342, the third extending line 346 and the fourth extending line 345 are disposed as an additional interdigitated structure and provide a higher layer-to-layer capacitance. The embedded capacitor with interdigitated structure according to the present invention provides a larger equivalent capacitance in the same circuit area resulting in the increasing of the side-to-side capacitance and layer-to-layer capacitance.

In this embodiment, the embedded capacitor with interdigitated structure may further comprise another interdigitated structure between the via pads. As shown in FIG. 4a, a fifth extending line 344 extended from the via pad 212 is parallel and adjacent to the first connecting line 221, and a sixth extending line 343 extended from the via pad 213 is parallel and adjacent to the fifth extending line 344 in the conductive layer 301. Similarly, a seventh extending line 347 extended from the via pad 213 is parallel and adjacent to the fourth connecting line 224, and an eighth extending line 348 extended from the via pad 212 is parallel and adjacent to the seventh extending line 347 in the conductive layer 302, as shown in FIG. 4b. The fifth extending line 344 is disposed over the seventh extending line 347, and the sixth extending line 343 is disposed over the eighth extending line 348. An interdigitated structure consisting of the fifth extending 344, the sixth extending line 343, the seventh extending line 347 and the eighth extending line 348 provides more additional capacitance. Thus, the embedded capacitor with interdigitated structure according to the present invention provides a larger equivalent capacitance in the same circuit area.

Figure 5A:
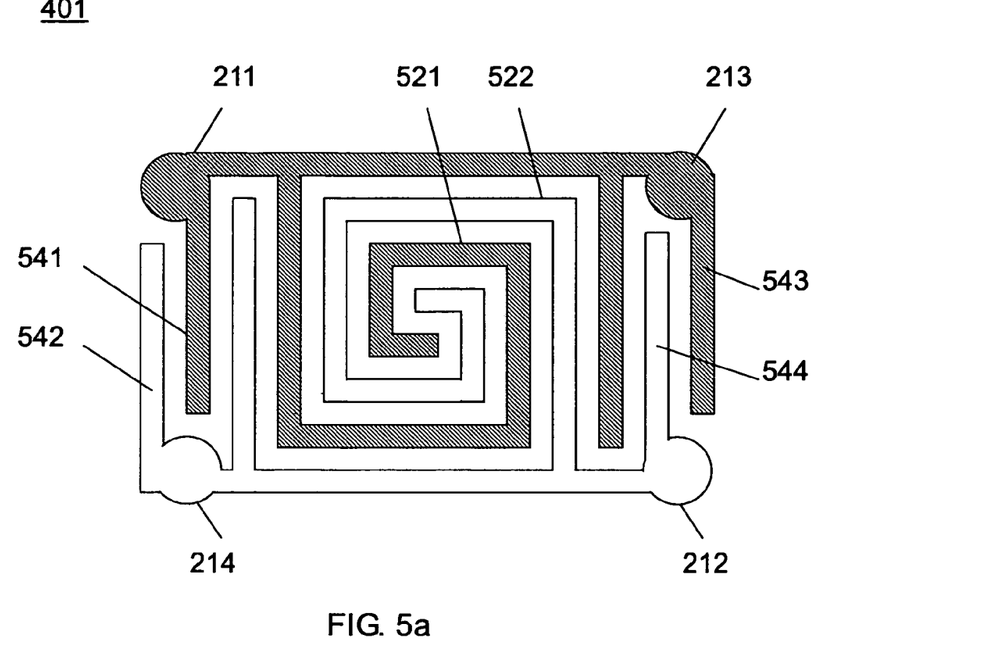
FIGS. 5a and 5b respectively show top views of two different conductive layers of a third embodiment according to the present invention.
Figure 5B:
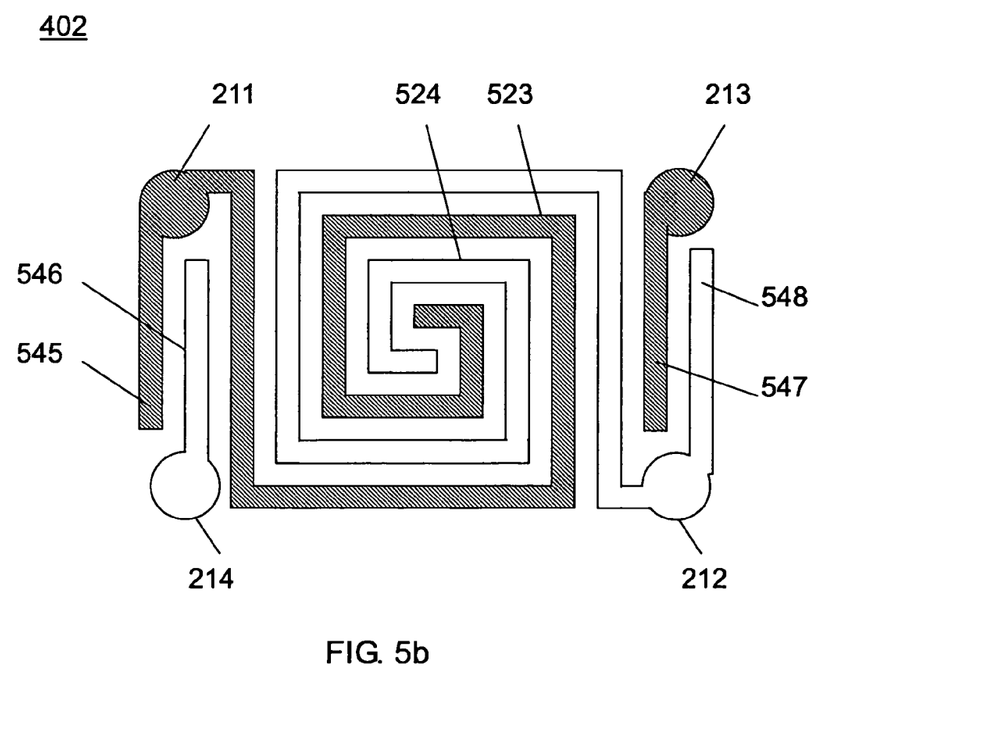

A third embodiment of an embedded capacitor with interdigitated structure according to the present invention is shown in FIGS. 5a and 5b. In this embodiment, the embedded capacitor with interdigitated structure comprises a conductive layer 401 and a conductive layer 402 alternatively stacked. FIGS. 5a and 5b respectively show top views of the conductive layers 401 and 402. The conductive layer 401 comprises a first spiral line 521, a second spiral line 522, a first extending line 541 adjacent to a part of the second spiral line 522, and a second extending line 542 adjacent to a part of the first extending line 541. The first extending line 541 is connected to the first via pad 211 and is extended toward the fourth via pad 214, and the second extending line 542 is connected to the fourth via pad 214 and extends toward the first via pad 211. The first spiral line 521 and the second spiral line 522 provide a first capacitance therebetween. The interdigitated structure consisting of the first extending line 541, the second extending line 542 and a part of the second spiral line 522 provides a second capacitance to achieve a higher equivalent capacitance of the conductive layer 401.

The conductive layer 402 comprises the third spiral line 523 disposed under the second spiral line 522, the fourth spiral line 524 disposed under the first spiral line 521, a third extending line 546 disposed under the first extending line 541, and a fourth extending line 545 disposed under the second extending line 542. Likewise, the interdigitated structure comprising the third extending line 546, the fourth extending line 545 and a part of the third spiral line 523 also provides an additional capacitance for the conductive layer 402. A first electrode of the conductive layer 401 comprises the first spiral line 521 and the first extending line 541, and a second electrode of the conductive layer 401 comprises the second spiral line 522 and the second extending line 542. A third electrode of the conductive layer 402 comprises the third spiral line 523 and the fourth extending line 545, and a fourth electrode of the conductive layer 402 comprises the fourth spiral line 524 and the third extending line 546. The second electrode of the conductive layer 401 is disposed over the third electrode of the conductive layer 402, and the first electrode of the conductive layer 401 is disposed over the fourth electrode of the conductive layer 402.

In this embodiment, a fifth extending line 544 adjacent to a part of the first spiral line 521 and a sixth extending line 543 adjacent to the fifth extending line 544 may be further disposed in the conductive layer 401. The conductive layer 402 may further comprise a seventh extending line 547 disposed under the fifth extending line 544 and an eighth extending line 548 disposed under the sixth extending line 543. Please note that the fifth extending line 544 is extended from the via pad 212 and the sixth extending line 543 is extended from the via pad 213. In other words, the first electrode further comprises the sixth extending line 543 and the second electrode further comprises the fifth extending line 544 in the conductive layer 401. Likewise, the third electrode further comprises the seventh extending line 547 and the fourth electrode further comprises the eighth extending line 548 in the conductive layer 402. The fifth extending line 544, the sixth extending 543 and a part of the first spiral line 521 form an interdigitated structure to enhance the capacitance of the conductive layer 401. The seventh extending line 547, the eighth extending line 548 and a part of the fourth spiral line 524 also form another interdigitated structure to enhance the capacitance of the conductive layer 402. At the same time, a layer-to-layer capacitance is increased because of the coupling between the fifth extending line 544 and the seventh extending line 547 and the coupling between the sixth extending line 543 and the eighth extending line 548.

The first spiral line 521 and the first extending line 541 of the conductive layer 401 and the third spiral line 523 and the fourth extending line 545 of the conductive layer 402 are electrically connected through a first via connecting structure having the via pads 211. The first spiral line 521 and the sixth extending line 543 of the conductive layer 401 and the seventh extending line 547 of the conductive layer 402 are electrically connected through a third via connecting structure having the via pads 213. The second spiral line 522 and the second extending line 542 of the conductive layer 401 and the third extending line 546 of the conductive layer 402 are electrically connected through a fourth via connecting structure having the via pads 214. The second spiral line 522 and the fifth extending line 544 (in FIG. 5a) of the conductive layer 401 and the fourth spiral line 524 and the eighth extending line 548 of the conductive layer 402 are electrically connected through a second via connecting structure having the via pads 212. The first electrode of the conductive layer 401, the third electrode of the conductive layer 402, the first via connecting structure and the third via connecting structure are coupled together and further having an electrical potential. The first via connecting structure and the third via connecting structure have the same structures for the interconnection between two conductive layers. That is, the first electrode of the conductive layer 401 and the third electrode of the conductive layer 402 may also be connected through two first via connecting structures, the second electrode of the conductive layer 401 and the fourth electrode of the conductive layer 402 may also be connected through two second via connecting structures. In this embodiment, the embedded capacitor with interdigitated structure is an alternatively stacked structure connected through the first via connecting structures and the second via connecting structures provides a higher layer-to-layer and side-to-side capacitance as the second embodiment.

Referring to the conductive layer 301 in FIG. 4a and the conductive layer 401 in FIG. 5a, at least an interdigitated structure between the first via connecting structure and the second via connecting structure couples with a stacked structure through a plurality of first via connecting structures and a plurality of second via connecting structures. A capacitance of the stacked structure is thus enhanced. The stacked structure has a plurality of planar conductive layers connected a plurality of first via connecting structures and through a plurality of second via connecting structures. The planar conductive layer is such as a spiral structure or an interdigitated structure.

TABLE 1

|  | C (pF) | L (nH) | R (ohm) |
|---|---|---|---|
| MIM capacitor | 0.99 | 1.31 | 1.45 |
| Conventional embedded capacitor with interdigitated structure as shown in FIGS. 2a to 2c | 2.04 | 1.24 | 0.65 |
| Second embodiment of the present invention | 2.99 | 1.14 | 0.52 |

Table 1 shows the performance of the MIM capacitor, the conventional embedded capacitor 110 with interdigitated structure as shown in FIGS. 2a to 2c and the second embodiment of the present invention using the same footprint (0.8×0.95 mm$^2$) in a four-layer circuit substrate. The substrate has a core layer thickness of 150 μm, other layer thickness of 100 μm, the conductor thickness of 27 μm in the top layer and the bottom layer, and the conductor thickness of 35 μm in other layers. The capacitance of the conventional embedded capacitor 110 with interdigitated structure is twice that of the MIM capacitor. Moreover, the capacitance of the second embodiment of the present invention is further enhanced near 50% comparing with that of the conventional embedded capacitor 110 with interdigitated structure because of the utilization in the space between via connecting structures. In addition, the resistance and the inductance of the second embodiment of the present invention are near to those of the conventional embedded capacitor 110 with interdigitated structure. It means that there are no other side-effects induced by the present invention. Therefore, the embedded capacitor with interdigitated structure according to the present invention achieves a higher capacitance in the same layout area and without any additional process and cost.

Preferably, two or more extending lines may be extended to a via pad in a conductive layer when the diameter of a via pad is larger than the pitch of the extending lines. The number of the extending lines from a via pad depends on the dimensional ratio between the diameter of a via pad and the pitch of the extending strips. On the other hand, a plurality of the planar conductive patterns could be parallel-coupled to achieve a higher equivalent capacitance.

Figure 6:
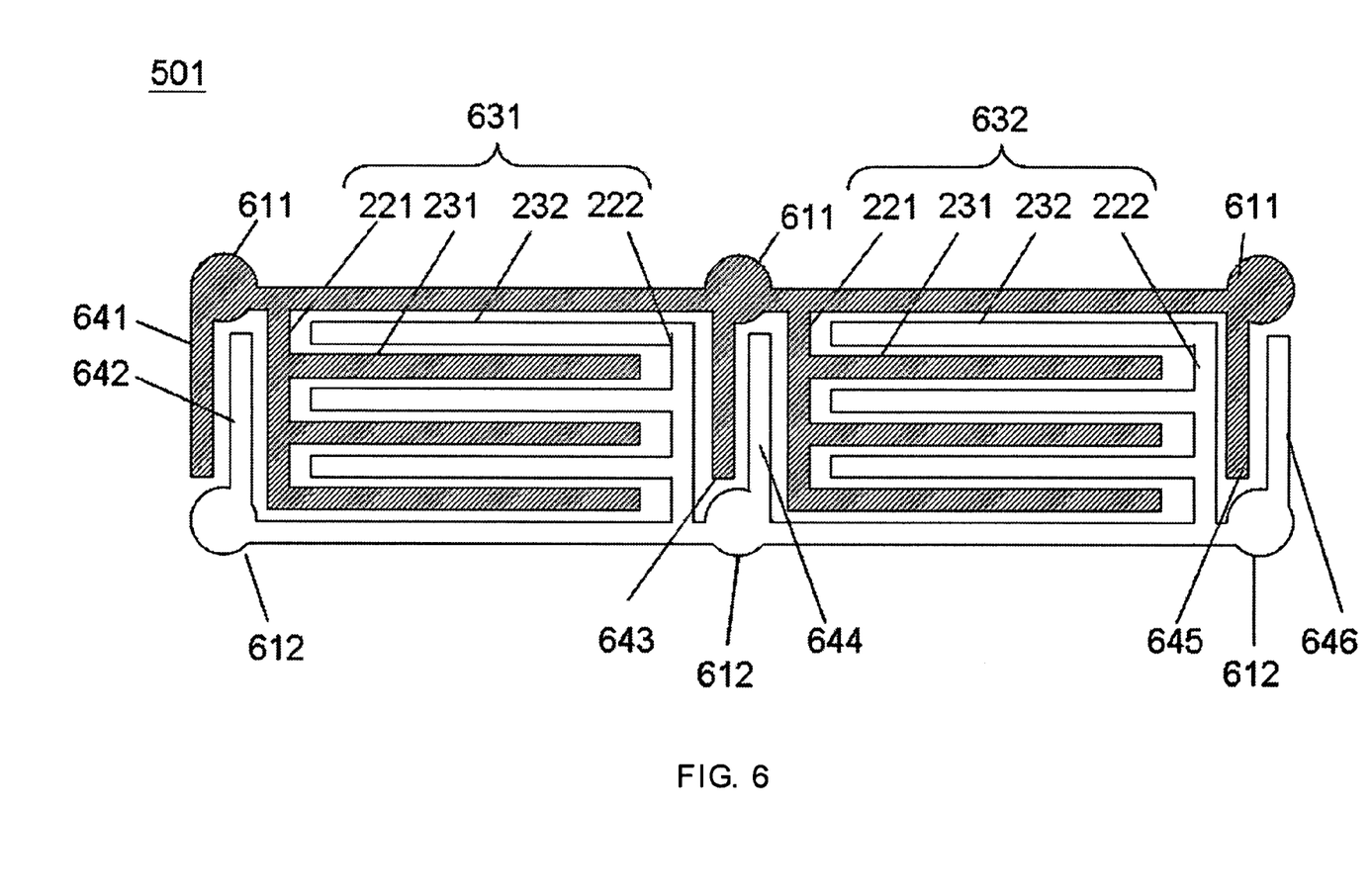
FIG. 6 shows a top view of a conductive layer of a fourth embodiment according to the present invention.

A fourth embodiment of an embedded capacitor with interdigitated structure according to the present invention is shown in FIG. 6, which comprising at least one conductive layer 501. The conductive layer 501 comprises a first interdigitated structure 631, a second interdigitated structure 632 and six extending lines 641 to 646 coupled through three first via pads 611 of a first via connecting structure and three second via pads 612 of a second via connecting structure. Please referring to FIGS. 4a and 6, the interdigitated structures 631 and 632 respectively comprise a plurality of first strips 231 and a plurality of second strips 232 interdigitately disposed with each other, a first connecting line 221 is respectively electrically connected to one end of the first strips 231, and a second connecting line 222 is respectively electrically connected to one end of the second strips 232. As shown in FIG. 6, the extending lines respectively form three interdigitated structures around the first interdigitated structure 631 and the second interdigitated structure 632 to provide an additional capacitance. In this embodiments, the embedded capacitor with interdigitated structure according to the present invention may further comprise a similar conductive layer disposed under the conductive layer 501 and connected with the conductive layer 501 through the first via connecting structure having the first via pads 611 and the second via connecting structure having the second via pads 612. Comparing to the first conductive layer 301 shown in FIG. 4a, the conductive layer 501 of this embodiment comprises two interdigitated structures 631 and 632 parallel-coupled and achieves a higher capacitance because of an optimized design within the space between two via connecting structures. By the same way, the conductive layer may comprise a plurality of conductive patterns to achieve a higher capacitance without leaving the spirits and the scopes of the present invention.

In summary, an embedded capacitor with interdigitated structure according to the present invention possesses at least the following advantages:

1. The embedded capacitor with interdigitated structure for a substrate having large vias can displace SMD-type capacitor to reduce the discontinuity effects of the soldering joint of the SMD-type capacitor.

2. The embedded capacitor with interdigitated structure provides a higher capacitance in the same layout area.

3. The embedded capacitor with interdigitated structure provides a symmetrical and compact structure to reduce the pattern size.

4. The embedded capacitor with interdigitated structure can be made by current fabrication processes. Furthermore, it improves the layout efficiency and reduces the fabrication cost.

Although the present invention is illustrated and described herein as embodied in one or more specific examples, it is nevertheless not intended to be limited to the details shown, since various modifications and structural changes may be made therein without departing from the spirit of the present invention and within the scope and claims be constructed broadly and in a manner consistent with the scope of the present invention, as set forth in the following claims.

What is claimed is:

1. An embedded capacitor with interdigitated structure for a substrate, comprising:
    a plurality of stacked conductive layers, the conductive layer has at least one first conductive pattern, the first conductive pattern comprises a first electrode and a second electrode, the first electrode comprises a plurality of first strips parallel to each other, a first connecting line respectively electrically connected to one end of the first strips and a first extending line, the second electrode comprises a plurality of second strips interdigitated with the first strips and a second connecting line respectively electrically connected to one end of the second strips;
    at least one first via connecting structure, electrically connected with the first electrode and at least one another conductive layer, wherein the first via connecting structure has at least one first via pad disposed in the conductive layer, a diameter of the first via pad being larger than a width of the first extending line; and
    at least one second via connecting structure, electrically connected with the second electrode and at least one another conductive layer;
    wherein the first extending line is extended from the first via connecting structure and is adjacent to the second electrode.

2. The embedded capacitor with interdigitated structure according to claim 1, wherein the second electrode of the first conductive pattern further comprises a second extending line electrically connected to the second via connecting structure and the second via connecting structure comprises at least one second via pad disposed in the conductive layer, a diameter of the second via pad is larger than a width of the second extending line.

3. The embedded capacitor with interdigitated structure according to claim 1, wherein the first extending line is extended from the first via pad.

4. The embedded capacitor with interdigitated structure according to claim 1, wherein at least a part of the first extending line is parallel and adjacent to the second connecting line.

5. The embedded capacitor with interdigitated structure according to claim 1, wherein the second electrode of the first conductive pattern further comprises a second extending line electrically connected to the second via connecting structure and is adjacent to the first electrode.

6. The embedded capacitor with interdigitated structure according to claim 5, wherein the second via connecting structure comprises at least one second via pad disposed in the conductive layer, the second extending line is extended from the second via pad.

7. The embedded capacitor with interdigitated structure according to claim 1, further comprising at least one second conductive pattern disposed in another conductive layer adjacent to the first conductive pattern, the second conductive pattern comprises a third electrode and a fourth electrode, the third electrode electrically connected to the first via connecting structure comprises a plurality of third strips and a third connecting line respectively disposed over or under the second strips and the second connecting line, the fourth electrode electrically connected to the second via connecting structure comprises a plurality of fourth strips, a fourth connecting line and a third extending line respectively disposed over or under the first strips, the first connecting line and the first extending line.

8. The embedded capacitor with interdigitated structure according to claim 7, wherein the third connecting line is respectively electrically connected to one end of the third strips, the fourth connecting line is respectively electrically connected to one end of the fourth strips, and the third strips and the fourth strips are interdigitated.

9. The embedded capacitor with interdigitated structure according to claim 1, which is adaptable for a multi layer package carrier or a multi-layer circuit board.

10. An embedded capacitor with interdigitated structure for a substrate, comprising:
    a plurality of conductive layers, the conductive layer has at least one first conductive pattern, the first conductive pattern comprises a first electrode, a second electrode, a first extending line and a second extending line;
    a plurality of first via connecting structures, electrically connected with at least two conductive layers wherein the first via connecting structure has at least one first via pad in the conductive layer, a diameter of the first via pad being larger than a width of the first extending line; and
    a plurality of second via connecting structures, electrically connected with at least two conductive layers;
    wherein the first electrode and the second electrode are respectively electrically connected to the first via connecting structure and the second via connecting structure, the first extending line and the second extending line are respectively electrically connected to the first via connecting structure and the second via connecting structure, the first extending line is adjacent to the second electrode and the second extending line is adjacent to the first electrode.

11. The embedded capacitor with interdigitated structure according to claim 10, wherein the first via connecting structure comprises at least one second via pad in the conductive layer, a diameter of the second via pad is larger than a width of the second extending line.

12. The embedded capacitor with interdigitated structure according to claim 10, wherein the first extending line is extended toward one of the second via connecting structures and the second extending line is extended toward one of the first via connecting structures.

13. The embedded capacitor with interdigitated structure according to claim 10, further comprising at least one second conductive pattern disposed in another conductive layer adjacent to the first conductive pattern, the second conductive pattern comprises a third electrode, a fourth electrode, a third extending line and a fourth extending line, the third electrode and the fourth electrode are respectively disposed over or under the second electrode and the first electrode, the third extending line and the fourth extending line are respectively disposed over or under the first extending line and the second extending line, wherein the third electrode electrically connects with at least one of the first via connecting structures, the fourth electrode electrically connects with at least one of the second via connecting structures, a third extending line electrically connects with at least one of the second via connecting structures, and the fourth extending line electrically connects with at least one of the first via connecting structures.

14. The embedded capacitor with interdigitated structure according to claim 10, wherein the first electrode and the second electrode are in interdigitated fashion.

15. The embedded capacitor with interdigitated structure according to claim 10, wherein the first electrode and the second electrode are in spiral fashion.

16. The embedded capacitor with interdigitated structure according to claim 10, which is adaptable for a multi layer package carrier or a multi-layer circuit board.

17. An embedded capacitor with interdigitated structure in a multiple conductive-layer substrate, comprising:
   a first pattern, disposed in one of the conductive layers comprising a first electrode and a second electrode, wherein the first electrode comprises a plurality of first strips parallel to each other, a first connecting line respectively electrically connected to one end of the first strips, and a first extending line adjacent to the second electrode, and the second electrode comprises a plurality of second strips interdigitated with the first strips, a second connecting line respectively electrically connected to one end of the second strips, and a second extending line adjacent to the first extending line;
   a second pattern, disposed in another conductive layer adjacent to the first pattern comprising a third electrode and a fourth electrode, wherein the third electrode comprises a plurality of third strips disposed over or under the second strips, a third connecting line disposed over or under the second connecting line, and a fourth extending line disposed over or under the second extending line, and the fourth electrode comprises a plurality of fourth strips disposed over or under the first strips, a fourth connecting line disposed over or under the first connecting line, and a third extending line disposed over or under the first extending line;
   a first via connecting structure, electrically connected with the first connecting line, the first extending line, the third connecting line and the fourth extending line wherein a via pad of the first via connecting structure has a diameter larger than a width of the first extending line;
   a second via connecting structure, electrically connected with the second connecting line and the second extending line;
   a third via connecting structure, electrically connected with the first connecting line; and
   a fourth via connecting structure, electrically connected with the second connecting line, the second extending line and the third extending line.

18. The embedded capacitor with interdigitated structure according to claim 17, wherein a via pad of the second via connecting structure has a diameter larger than a width of the second extending line.

19. The embedded capacitor with interdigitated structure according to claim 17, further comprising a fifth extending line adjacent to the first connecting line and a sixth extending line adjacent to the fifth extending line, wherein the fifth extending line is electrically connected to the third via connecting structure and the sixth extending line is electrically connected to the second via connecting structure.

20. The embedded capacitor with interdigitated structure according to claim 19, further comprises a seventh extending line disposed over or under the fifth extending line and a eighth extending line disposed over or under the sixth extending line, wherein the seventh extending line is electrically connected to the third via connecting structure and the eighth extending line is electrically connected to the second via connecting structure.

21. The embedded capacitor with interdigitated structure according to claim 17, which is adaptable for a multi-layer package carrier or a multi-layer circuit board.

22. The embedded capacitor with interdigitated structure according to claim 17, wherein the first extending line is adjacent and parallel to the second connecting line and the third extending line is adjacent and parallel to the third connecting line.

* * * * *